(12) United States Patent
Wang et al.

(10) Patent No.: US 11,347,149 B2
(45) Date of Patent: May 31, 2022

(54) PHOTORESIST STRIPPER COMPOSITION

(71) Applicant: Henkel AG & Co. KGaA, Duesseldorf (DE)

(72) Inventors: Tengfang Wang, Shanghai (CN); Yongjun Wang, Shanghai (CN)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 16/895,012

(22) Filed: Jun. 8, 2020

(65) Prior Publication Data
US 2020/0301284 A1  Sep. 24, 2020

Related U.S. Application Data

(63) Continuation of application No. PCT/CN2017/115196, filed on Dec. 8, 2017.

(51) Int. Cl.
| | |
|---|---|
| *C11D 7/32* | (2006.01) |
| *G03F 7/42* | (2006.01) |
| *C11D 3/30* | (2006.01) |
| *C11D 3/43* | (2006.01) |
| *G03F 7/30* | (2006.01) |
| *C11D 11/00* | (2006.01) |

(52) U.S. Cl.
CPC ........... *G03F 7/425* (2013.01); *C11D 3/30* (2013.01); *C11D 3/43* (2013.01); *G03F 7/3057* (2013.01); *C11D 11/0047* (2013.01)

(58) Field of Classification Search
CPC ................................................ C11D 11/0047
USPC ....................................................... 510/175
See application file for complete search history.

(56) References Cited

U.S. PATENT DOCUMENTS

| | | | |
|---|---|---|---|
| 6,040,117 A | 3/2000 | Ota et al. | |
| 6,248,704 B1 * | 6/2001 | Small | C11D 3/43 510/176 |
| 6,319,835 B1 * | 11/2001 | Sahbari | G03F 7/425 438/689 |
| 6,417,112 B1 | 9/2002 | Peyne et al. | |

(Continued)

FOREIGN PATENT DOCUMENTS

| | | |
|---|---|---|
| CN | 1690865 A | 11/2005 |
| CN | 101544932 A | 9/2009 |

(Continued)

OTHER PUBLICATIONS

International Search Report for PCT/CN2017/115196, dated Sep. 5, 2018.

(Continued)

*Primary Examiner* — Gregory E Webb
(74) *Attorney, Agent, or Firm* — Mary K. Cameron

(57) ABSTRACT

This invention relates to a photoresist stripper composition. The photoresist stripper composition according to the present invention comprises at least one choline compound; at least one polar aprotic solvent; and water; the weight percentage of the choline compound is from 2.5 to 50%, preferably from 5 to 50%, more preferably from 7 to 30%, and most preferably from 9 to 18% by weight based on the total weight of the composition. The photoresist stripper composition according to the present invention exhibits excellent photoresist cleaning performance and low etching to the substrate.

19 Claims, 3 Drawing Sheets

(56) References Cited

U.S. PATENT DOCUMENTS

| | | | |
|---|---|---|---|
| 2002/0037820 A1* | 3/2002 | Small | H01L 21/02071 510/175 |
| 2003/0130149 A1* | 7/2003 | Zhou | C11D 7/34 510/176 |
| 2004/0038840 A1* | 2/2004 | Lee | C11D 3/30 510/202 |
| 2004/0147421 A1* | 7/2004 | Charm | C11D 7/34 510/176 |
| 2005/0089489 A1* | 4/2005 | Carter | C11D 7/08 424/70.1 |
| 2005/0202987 A1* | 9/2005 | Small | G03F 7/426 510/175 |
| 2005/0250660 A1 | 11/2005 | Takashima | |
| 2005/0263743 A1* | 12/2005 | Lee | C11D 7/3218 252/364 |
| 2006/0016785 A1* | 1/2006 | Egbe | H01L 21/02063 216/83 |
| 2006/0094613 A1* | 5/2006 | Lee | H01L 21/31133 510/175 |
| 2006/0115970 A1* | 6/2006 | Lee | C11D 7/3209 438/584 |
| 2006/0172905 A1* | 8/2006 | Rovito | C11D 7/10 510/175 |
| 2006/0293208 A1* | 12/2006 | Egbe | G03F 7/425 510/407 |
| 2007/0060490 A1* | 3/2007 | Skee | C11D 11/0047 510/175 |
| 2007/0161528 A1* | 7/2007 | Wu | C11D 7/28 510/175 |
| 2012/0108485 A1 | 5/2012 | Kamimura | |
| 2014/0100151 A1* | 4/2014 | Egbe | C11D 7/34 510/176 |
| 2016/0186106 A1* | 6/2016 | Du | C11D 7/261 510/176 |
| 2017/0335252 A1* | 11/2017 | Mizutani | G03F 7/423 |
| 2020/0301284 A1* | 9/2020 | Wang | C11D 7/3218 |

FOREIGN PATENT DOCUMENTS

| | | |
|---|---|---|
| CN | 103424999 A | 12/2013 |
| EP | 2098911 A2 | 9/2009 |
| KR | 101493294 B1 | 2/2015 |
| WO | 0227409 A1 | 4/2002 |

OTHER PUBLICATIONS

Supplementary Partial European Search Report for EP 17934047 dated May 31, 2021, 4 pages.

* cited by examiner

_Fig. 1_
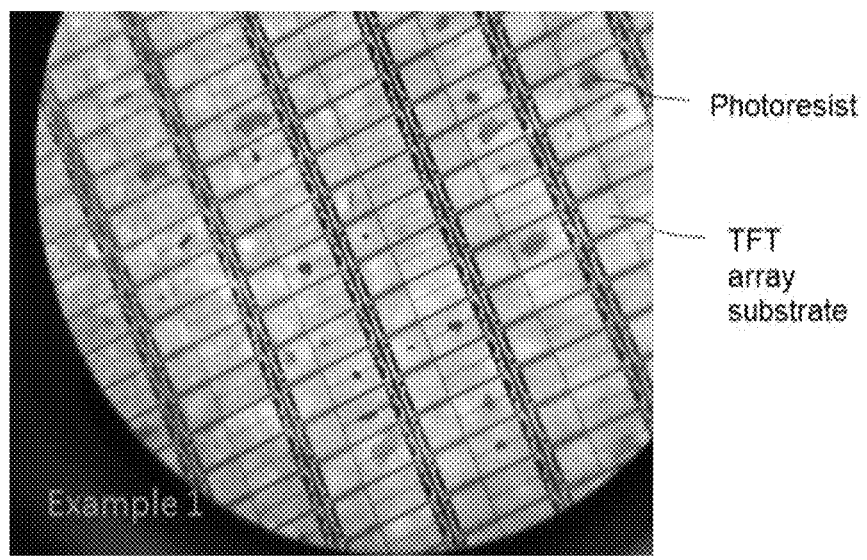
_Fig. 2_
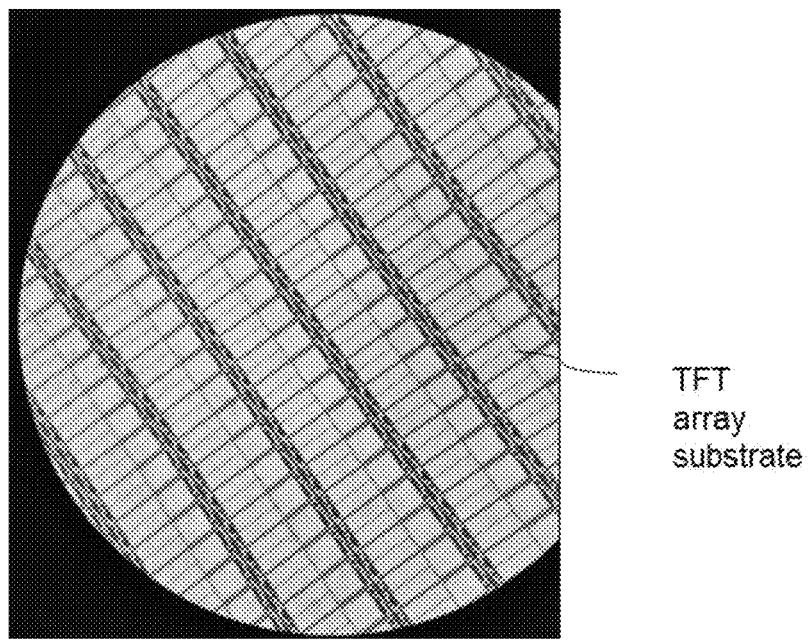

PHOTORESIST STRIPPER COMPOSITION

TECHNICAL FIELD

This invention relates to a photoresist stripper composition. The photoresist stripper composition according to the present invention comprises at least one choline compound; at least one polar aprotic solvent; and water; the weight percentage of the choline compound is from 2.5 to 50%, preferably from 5 to 50%, more preferably from 7 to 30%, and most preferably from 9 to 18% by weight based on the total weight of the composition. The photoresist stripper composition according to the present invention exhibits excellent photoresist cleaning performance and low etching to the substrate.

BACKGROUND OF THE INVENTION

Liquid crystal displays (LCDs) have been widely used in various electronics such as monitors for mobile phones, televisions, digital cameras, laptop computers, and notebook computers.

A traditional liquid crystal display (LCD) panel comprises a liquid crystal layer laminated in between a front glass panel and a back glass panel. A thin film transistor array substrate (TFT array substrate) is formed on the back glass panel to drive the rotation of liquid crystals and control the display of each pixel, while a color filter (CF) layer is deposited on the front glass to form the color for each pixel. In addition, an over coating (OC) layer may be optionally deposited over the CF layer to provide flatness to the CF layer.

In recent years, a new LCD panel is developed. The CF layer is integrated into the TFT array substrate. This new LCD panel has many advantages such as improved contrast, increased aperture ratio, reduced alignment errors and light leakage.

The CF layer in the new LCD panel contains photoresist materials incorporated with color pigments. The pigments in the CF layer, however, are sometimes not properly distributed making the color of the CF layer uneven. It will consequently render the LCD panel comprising the TFT array substrate not suitable for use and cause undesirable cost and waste.

Moreover, there is a new trend to also integrate the OC layer into the TFT array substrate. The OC layer covers the CF layer and contains photoresist materials which may be the same or different from the photoresist materials in the CF layer. The OC layer needs to be stripped off together with the CF layer when there is any flaw in the CF layer.

A number of photoresist cleaners have been developed to remove the photoresist materials from the TFT array substrate. The photoresist cleaner for TFT array substrate has higher requirements than for traditional cleaners. For example, in order to make the TFT array substrate reworkable, the photoresist cleaner has to be able to efficiently remove the photoresist materials from the TFT array substrate without damaging the metal electrodes in the TFT array substrate which is arranged under the CF layer.

Moreover, most of the photoresist cleaners available target the positive photoresist materials. The positive photoresist materials are in general weakly adhered to the substrate. It is more readily dissolved and removed in acetone or alkaline solution. Negative photoresist materials, on the other hand, undergo a crosslinking reaction upon curing, and therefore form a much stronger polymer on the substrate than the positive photoresist materials after curing. It is consequently more difficult to be removed compared with the positive photoresist materials.

Many of the photoresist cleaners on the market are based on tetramethylammonium hydroxide (TMAH). The cleaning performance of the cleaners containing TMAH is not good enough. More importantly, TMAH is toxic and it is not friendly to the environment and the health of workers who are constantly exposed to it.

Therefore, there is a need for developing a photoresist cleaner that has strong photoresist cleaning performance, low etching to the metal electrodes (e.g. copper) in the TFT array substrate and is less toxic for health.

SUMMARY OF THE INVENTION

The present invention relates to a photoresist stripper composition, comprising:
(a) at least one choline compound;
(b) at least one polar aprotic solvent; and
(c) water;
the weight percentage of the choline compound is from 2.5 to 50%, preferably from 5 to 50%, more preferably from 7 to 30%, and most preferably from 9 to 18% by weight based on the total weight of the composition.

The photoresist stripper composition has high photoresist cleaning efficiency and has low etching to the metal electrodes in the TFT array substrate.

The present invention also relates to a process of making the photoresist stripper composition, comprising a step of mixing the components of the photoresist stripper composition.

The present invention also relates to a substrate obtained from removing photoresist materials covered on the substrate by using the photoresist stripper composition.

The present invention also relates to a photoresist cleaning performance assessing method for the photoresist stripper composition, comprising steps of:
(a) warming the photoresist stripper composition;
(b) soaking a substrate covered by photoresist materials in the warmed photoresist stripper composition;
(c) rinsing the substrate with water; and
(d) observing the surface of the substrate for the removal of photoresist materials.

The present invention also relates to a metal etching assessing method for the photoresist stripper composition, comprising steps of:
(a) measuring the thickness ($\omega$) and initial resistivity ($Rs_{(pre)}$) of a metal substrate;
(b) warming the photoresist stripper composition;
(c) soaking the metal substrate in the warmed photoresist stripper composition and recording the soaking time (t);
(d) measuring the post resistivity ($Rs_{(post)}$) of the metal substrate; and
(e) calculating the metal etching rate (ER) according to the following formula (I):

$$ER = Rs_{(pre)} \omega (1/Rs_{(pre)} - 1/Rs_{(post)})/t.$$

The present invention also relates to a stability test for the photoresist stripper composition, comprising the steps of:
(a) warming the photoresist stripper composition;
(b) soaking a substrate covered by photoresist materials in the warmed photoresist stripper composition;
(c) rinsing the substrate with water;
(d) observing the surface of the substrate for the removal of photoresist materials; and (e) repeating steps (b), (c) and (d) with new substrates covered by photoresist materials at predetermined time intervals.

BRIEF DESCRIPTION OF THE FIGURES

FIG. 1 illustrates the surface of the TFT array substrate after being cleaned by the photoresist stripper composition in Example 1 observed under a microscope at the magnification of 75×;

FIG. 2 illustrates the surface of the TFT array substrate after being cleaned by the photoresist stripper composition in Example 4 observed under a microscope at the magnification of 75×;

DETAILED DESCRIPTION OF THE INVENTION

Figure 3:
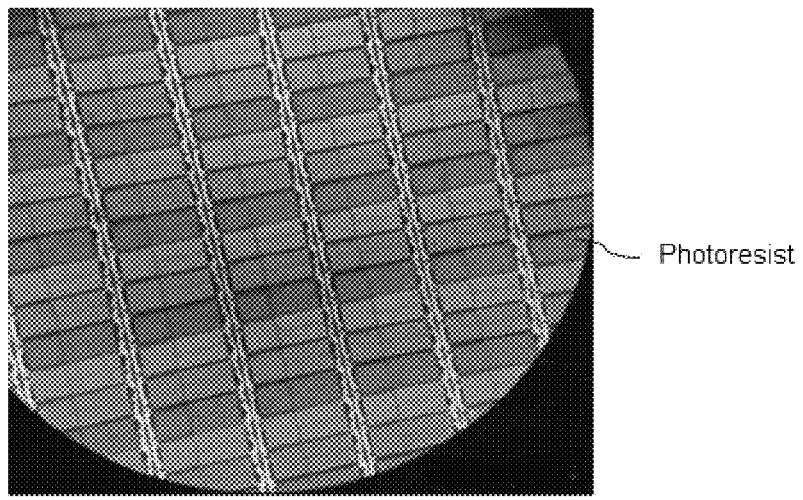
FIG. 3 illustrates the surface of the TFT array substrate after being cleaned by the photoresist stripper composition in Example 10 observed under a microscope at the magnification of 75×.

In the following passages the present invention is described in more detail. Each aspect so described may be combined with any other aspect or aspects unless clearly indicated to the contrary. In particular, any feature indicated as being preferred or advantageous may be combined with any other feature or features indicated as being preferred or advantageous.

In the context of the present invention, the terms used are to be construed in accordance with the following definitions, unless a context dictates otherwise.

As used herein, the singular forms "a", "an" and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or process steps.

The recitation of numerical end points includes all numbers and fractions subsumed within the respective ranges, as well as the recited end points.

All references cited in the present specification are hereby incorporated by reference in their entirety.

Unless otherwise defined, all terms used in the disclosing the invention, including technical and scientific terms, have the meaning as commonly understood by one of the ordinary skill in the art to which this invention belongs to. By means of further guidance, term definitions are included to better appreciate the teaching of the present invention.

In the context of this disclosure, a number of terms shall be utilized.

The term "protic solvent" according to the invention means a solvent which contains a hydrogen attached to an oxygen or a nitrogen so that it is able to form hydrogen bonds or donate a proton.

The term "polar aprotic solvent" according to the invention means a polar solvent which does not contain acidic hydrogen and does not act as a hydrogen bond donor.

Choline Compound

The choline compound of the present invention refers to a choline compound or choline derivative compound in the hydroxide or salt form.

The choline compound includes but not limited to mono-choline compound, bis-choline compound, tris-choline compound, higher choline compound or derivative thereof. Preferably, the choline compound is selected from choline hydroxide, choline bicarbonate, choline chloride, choline bitartrate, choline dihydrogen citrate, choline sulphate and any combination thereof.

Formula of a specific example of the choline compound is shown below.

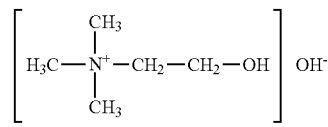

Examples of commercially available choline compound are, for example, mono-choline compound (Choline Hydroxide (48-50% in water)) from TCI, and tris-choline compound (Tris(2-hydroxyethyl)methylammonium Hydroxide (45-50% in water)) from TCI.

In some embodiments of the present invention, the amount of the choline compound is from 2.5 to 50%, preferably from 5 to 50%, more preferably from 7 to 30%, and most preferably from 9 to 18% by weight based on the total weight of the composition. Choline compound with a concentration more than 50% is not stable and easily changes color which will lead to subsequence performance failure of the photoresist stripper composition.

In some embodiments of the present invention, mono-choline compound or derivative thereof, i.e., the choline compound having only one hydroxyethyl group attached to the central nitrogen is preferred to be included in the photoresist stripper composition. When the bis-choline compound or tris-choline compound is used, the photoresist stripper composition can stay stable for one or two of days under its working temperature (e.g. 78° C.). Further experiments have shown that the photoresist stripper composition comprising the mono-choline compound can be used for over three days at its working temperature (e.g. 78° C.) and still can clean the photoresist materials efficiently from the TFT array substrate.

Polar Aprotic Solvent

The polar aprotic solvent includes but not limited to N-methyl pyrrolidone (NMP), dimethyl sulfoxide (DMSO), dimethylformamide (DMF), 1,3-dimethyl-2-imidazolidinone (DMI), propylene carbonate (PC) and any combination thereof.

Examples of commercially available polar aprotic solvent are, for example, N-methyl pyrrolidone (NMP) from Sinopharm Group Co. Ltd., DMSO from Sinopharm Group Co. Ltd., and 1,3-dimethyl-2-imidazolidinone from Sinopharm Group Co. Ltd.

In some embodiments of the present invention, the amount of the polar aprotic solvent is from 10 to 90%, preferably from 15 to 85%, and more preferably from 15 to 75% by weight based on the total weight of the composition.

Water

Unlike the conventionally available photoresist cleaners which are essentially water free or contain very little water content, the amount of water in the present invention prefers to be greater than or equal to 11%, more preferably greater than or equal to 13%, and even more preferably from 13% to 87.5% based on the total weight of the composition.

Without wishing to be bound by theory, it is believed that by having enough water content in the photoresist stripper composition, it is easier to establish an alkaline environment that helps to dissolve the photoresist materials.

Alkaline Substance

The alkaline substance of the present invention refers to any substance that tends to accept hydrogen ions in solution.

The alkaline substance includes inorganic alkaline substance, organic alkaline substance or their combination thereof, preferably having a pKa value of 2 to 12, and more preferably having a pH value of 7 to 11 when dissolved in water at 25° C. In some embodiments, it is found that the photoresist stripper composition comprising an alkaline substance with a pKa value greater than 12 tends to corrode the metal electrode in the TFT array substrate during the cleaning process.

The suitable inorganic substance includes but not limited to sodium bicarbonate, potassium bicarbonate, sodium carbonate, potassium carbonate, calcium carbonate, magnesium carbonate, calcium hydroxide, magnesium hydroxide and any combination thereof. The suitable organic substance includes but not limited to ethanolamine (MEA), aminopyridine, butylamine, chloridine, diethanolamine, dimethylamine, dimethylimidazole, ephedrine, ethylmorpholine, glycylglycine, hydroxypyroline, piperidine, propylamine, methylamine, methylimidazole, triethylamine, triethanolamine, trimethylamine, tris(hydroxymethyl)aminomethanol, 2-amino-2-ethyl-1,3-propanediol, 2-amino-2-methyl-1,3-propanediol, 2-amino-2-methyl-1-propanol, and any combination thereof.

Examples of commercially available alkaline substance are, for example, ethanolamine from Sinopharm Group Co. Ltd., and 2-(2-Aminoethoxy) ethanol from Aladdin.

In some embodiments of the present invention, the amount of the alkaline substance is from 0 to 50%, preferably from 5 to 30% and more preferably from 10 to 20% by weight based on the total weight of the composition.

In a preferred embodiment, the photoresist stripper composition comprises:
- (a) from 2.5 to 50% by weight of at least one choline compound;
- (b) from 10 to 90% by weight of at least one polar aprotic solvent;
- (c) from 11 to 87.5% by weight of water; and
- (d) from 0 to 50% by weight of at least one alkaline substance;

wherein the weight percentages of all components add up to 100% by weight.

The photoresist stripper composition of the present invention may be prepared by mixing the components of the photoresist stripper composition.

A substrate may be obtained from removing photoresist materials covered on the substrate by using the photoresist stripper composition.

The photoresist cleaning performance of the photoresist stripper composition may be assessed by a method comprising steps of:
- (a) warming the photoresist stripper composition;
- (b) soaking a substrate covered by photoresist materials in the warmed photoresist stripper composition;
- (c) rinsing the substrate with water; and
- (d) observing the surface of the substrate for the removal of photoresist materials.

The metal etching of the photoresist stripper composition may be assessed by a method comprising steps of:
- (a) measuring the thickness ($\omega$) and initial resistivity ($Rs_{(pre)}$) of a metal substrate;
- (b) warming the photoresist stripper composition;
- (c) soaking the metal substrate in the warmed photoresist stripper composition and recording the soaking time (t);
- (d) measuring the post resistivity ($Rs_{(post)}$) of the metal substrate; and
- (e) calculating the metal etching rate (ER) according to the following formula (I):

$$ER = Rs_{(pre)} \omega (1/Rs_{(pre)} - 1/Rs_{(post)})/t.$$

The stability of the photoresist stripper composition may be assessed by a method comprising the steps of:
- (a) warming the photoresist stripper composition;
- (b) soaking a substrate covered by photoresist materials in the warmed photoresist stripper composition;
- (c) rinsing the substrate with water;
- (d) observing the surface of the substrate for the removal of photoresist materials; and
- (e) repeating steps (b), (c) and (d) with new substrates covered by photoresist materials at predetermined time intervals.

EXAMPLES

The present invention will be further described and illustrated in detail with reference to the following examples. The examples are intended to assist one skilled in the art to better understand and practice the present invention, however, are not intended to restrict the scope of the present invention. All numbers in the examples are based on weight unless otherwise stated.

Test Methods

Cleaning Performance for a TFT Array Substrate Covered with a CF Layer Containing Negative Photoresist Materials Warmed a photoresist stripper composition sample to 78° C. with a water bath. Soaked a TFT array substrate covered with a CF layer containing negative photoresist materials in the warmed photoresist stripper composition sample at 78° C. for 30 minutes. Took the TFT array substrate out and rinsed it thoroughly with water. Checked to see if the photoresist materials were removed or not under a microscope (Daheng Imavision DH-HV315) at a magnification of 75×. If the photoresist materials were fully removed, the photoresist stripper composition sample was ranked as ⊚; if 80% or more of the photoresist materials were removed, the photoresist stripper composition sample was ranked as ○; if 50% or more, but less than 80% of the photoresist materials were removed, the photoresist stripper composition sample was ranked as Δ; if less than 50% of the photoresist materials were removed, the photoresist stripper composition sample was marked as ∇; if the photoresist materials were not removed at all, the photoresist stripper composition sample was ranked as X.

Cleaning Performance for a TFT Array Substrate Covered with a CF Layer Containing Negative Photoresist Materials and an OC Layer Containing Positive Photoresist Materials After the OC layer was deposited on the CF layer, if the removal of CF layer was observed, the positive photoresist materials in the OC layer had to be removed first. Therefore, the degree of positive photoresist material removed from the OC layer can be assessed by the degree of negative photoresist material removed from the CF layer.

Warmed a photoresist stripper composition sample to 78° C. with a water bath. Soaked a TFT array substrate covered with a CF layer containing negative photoresist materials and an OC layer containing positive photoresist materials which was deposited on the CF layer in the warmed photoresist stripper composition sample at 78° C. for 30 minutes. Took the TFT array substrate out and rinsed it thoroughly with water. Checked to see if the photoresist materials were removed or not under a microscope (Daheng Imavision DH-HV315) at a magnification of 75×. If the photoresist materials were fully removed, the photoresist stripper composition sample was ranked as ⊚; if 80% or more of the photoresist materials were removed, the photoresist stripper composition sample was ranked as ○; if 50% or more, but less than 80% of the photoresist materials were removed, the photoresist stripper composition sample was ranked as Δ; if less than 50% of the photoresist materials were removed, the photoresist stripper composition sample was marked as ∇; if the photoresist materials were not removed at all, the photoresist stripper composition sample was ranked as X.

Copper Etching Rate

Took a copper wafer (from Philtech Inc., with a thickness of 3073 Å and uniformity of 0.73%) and measured the initial resistivity ($Rs_{(pre)}$) of it by four point probe method using the equipment of NAPSON model RT-7oV.

Warmed a photoresist stripper composition sample to 78° C. with a water bath. Soaked the copper wafer in the warmed photoresist stripper composition sample at 78° C. for 30 minutes.

Took the copper wafer out and measured the resistivity of it ($Rs_{(post)}$) as for the initial resistivity ($Rs_{(pre)}$). Etching rates were calculated and converted into Angstrom per minute (Å/min) from the equation:

$$ER = Rs_{(pre)} \omega (1/Rs_{(pre)} - 1/Rs_{(post)})/t,$$

wherein,
ER represents etching rate, with a unit of 'Å/min';
$Rs_{(pre)}$ represents initial resistivity before soaking the copper wafer in the photoresist stripper composition, with a unit of mΩ/square;
ω represents copper thickness;
$Rs_{(post)}$ represents resistivity after soaking the copper wafer in the photoresist stripper composition, with a unit of mΩ/square;
t represents soaking time, with a unit of min.

If the etching rate was ≤5 Å/min, the photoresist stripper composition sample was considered to be acceptable and was ranked as "Pass";
If the etching rate was >5 Å/min, the photoresist stripper composition sample was considered to be unacceptable and was ranked as "Fail".

Stability Test for the Photoresist Stripper Composition

Warmed a photoresist stripper composition sample to 78° C. with a water bath and maintained the temperature of the photoresist stripper composition sample through the stability test. Soaked a TFT array substrate covered with negative photoresist materials in the warmed photoresist stripper composition sample for 30 minutes. Repeated the soaking process with new TFT array substrates covered with negative photoresist materials every 24 hours. Took the TFT array substrate out and rinsed it thoroughly with water. Checked to see if the photoresist materials were removed or not under a microscope (Daheng Imavision DH-HV315) at a magnification of 75×. If 80% of the photoresist materials or more were fully removed, the photoresist stripper composition sample was ranked as "Pass"; If less than 80% of the photoresist materials were removed, the photoresist stripper composition sample was ranked as "Fail".

Examples from 1 to 24

Photoresist stripper composition samples were prepared, according to Tables 1A, 1B, 1C, 3 and 5 by mixing the components selected from:
Mono-choline compound (Choline Hydroxide (48-50% in water) from TCI);
Tris-choline compound (Tris(2-hydroxyethyl)methylammonium Hydroxide (45-50% in water) from TCI);
DMSO (Dimethyl Sulfoxide from Sinopharm Group Co. Ltd.);
NMP (N-Methyl pyrrolidone from Sinopharm Group Co. Ltd.);
Propylene glycol (from Sinopharm Group Co. Ltd.);
Ethylene glycol (from Sinopharm Group Co. Ltd.);
Diethylenetriamine (Diethylenetriamine from Sinopharm Group Co. Ltd.);
MEA (Monoethanolamine from Sinopharm Group Co. Ltd.);
DGME (Diethylene Glycol Monomethyl Ether from Sinopharm Group Co. Ltd.); and
Deionized water.

TABLE 1A

| Component | Weight % Example 1 | Example 2 | Example 3 | Example 4 | Example 5 | Example 6 | Example 7 |
|---|---|---|---|---|---|---|---|
| Mono-choline compound | 2.8 | 5.25 | 7 | 9.45 | 13 | 13.3 | 17.5 |
| DMSO | 47 | 50 | 45 | 73 | 74 | | 50 |
| NMP | | | | | | 50 | |
| MEA | 20 | 12 | 12 | | | | |
| Deionized water | 30.2 | 32.75 | 36 | 17.55 | 13 | 36.7 | 32.5 |
| Total | 100 | 100 | 100 | 100 | 100 | 100 | 100 |

TABLE 1B

Photoresist stripper compositions

| | Weight % | | | | | | |
|---|---|---|---|---|---|---|---|
| Component | Example 8 | Example 9 | Example 10 | Example 11 | Example 12 | Example 13 | Example 14 |
| Mono-choline compound | 29.75 | 2.3 | 13.3 | 13.3 | 13.3 | 33.25 | 5.5 |
| DMSO | 15 | 50 | | | | 5 | 89 |
| Propylene glycol | | | 62 | | | | |
| Ethylene glycol | | | | 50 | | | |
| Diethylene triamine | | | | | 50 | | |
| Deionized water | 55.25 | 47.7 | 24.7 | 36.7 | 36.7 | 61.75 | 5.5 |
| Total | 100 | 100 | 100 | 100 | 100 | 100 | 100 |

TABLE 1C

Photoresist stripper compositions

| | Weight % | | |
|---|---|---|---|
| Component | Example 15 | Example 16 | Example 17 |
| Mono-choline compound | 9 | 9 | 5.25 |
| DMSO | 82 | 72 | 85 |
| MEA | | 10 | |
| Deionized water | 9 | 9 | 9.75 |
| Total | 100 | 100 | 100 |

In Tables 2A, 2B and 2C, the negative photoresist cleaning performance and the copper etching rate of the samples in Examples 1 to 17 are reported. FIGS. 1 to 5 also show exemplary results of the surface of the TFT array substrate after being cleaned by different photoresist stripper composition samples observed under a microscope at the magnification of 75×. It is found that samples through Examples 1 to 8 have much better photoresist cleaning performance compared with samples in Examples 9 to 17.

Samples from Examples 1 to 8 can efficiently clean the negative photoresist materials from the surface of the TFT array as shown in FIGS. 1 and 2. When the weight percentage of the choline hydroxide in the photoresist stripper composition was too low as shown in Example 9 or when a protic solvent was used instead of a polar aprotic solvent as in Examples 10 to 12, the photoresist materials were not removed from the TFT array substrate at all as shown in FIG. 3.

When the weight percentage of the polar aprotic solvent was low as in Example 13, the photoresist materials were removed from the TFT array substrate. However, the copper etching rate was greater than 5 A/min and not acceptable for the cleaning of TFT array substrate.

Figure 4:
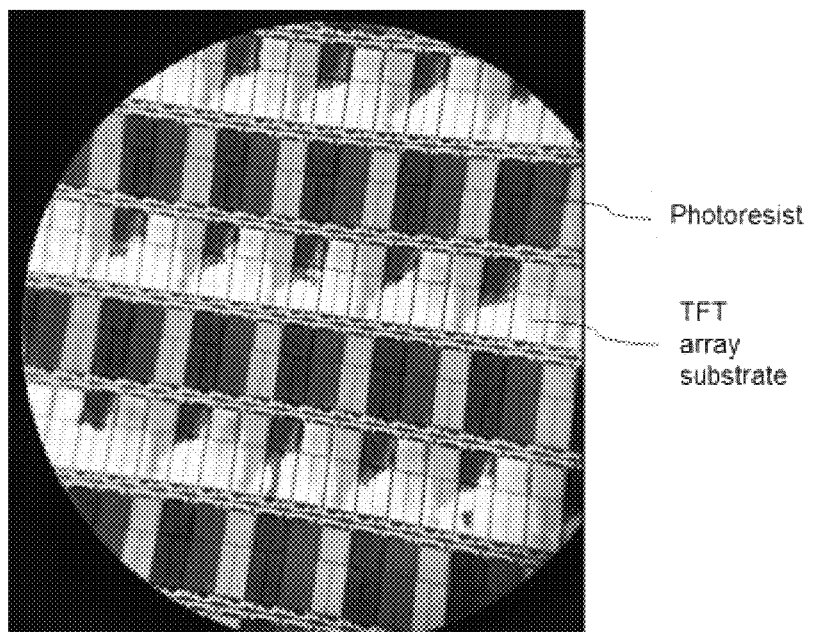
FIG. 4 illustrates the surface of the TFT array substrate after being cleaned by the photoresist stripper composition in Example 14 observed under a microscope at the magnification of 75×.
Figure 5:
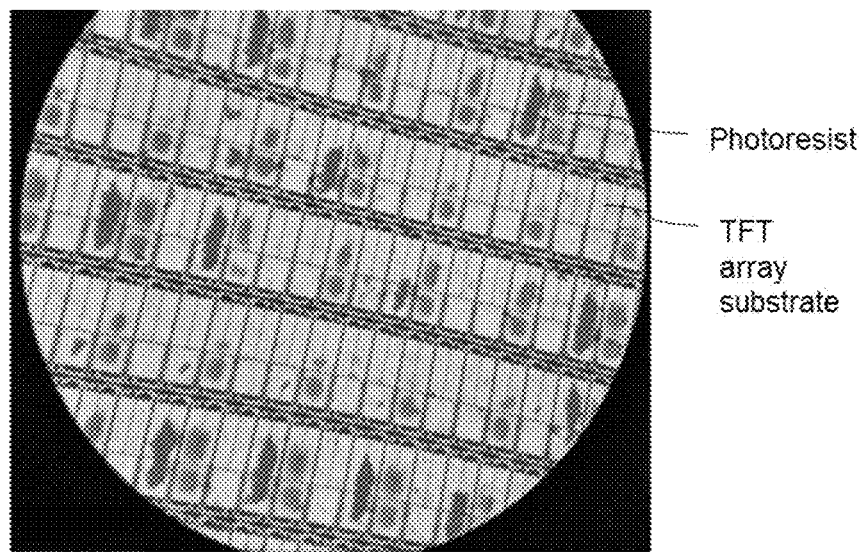
FIG. 5 illustrates the surface of the TFT array substrate after being cleaned by the photoresist stripper composition in Example 17 observed under a microscope at the magnification of 75×.

As shown in Example 14 to 17, when the water content was low, the photoresist materials were removed from the TFT array substrate to a various degree. Even when an alkaline substance, MEA for example, was added, the photoresist materials were still not completely removed from the TFT array substrate as shown in Example 16. As the water content increased as shown in Example 17 compared with Example 14, the photoresist cleaning performance of the photoresist stripper got improved as shown in FIGS. 4 and 5.

In the meanwhile, samples through Examples 1 to 8 also have acceptable copper etching rates, making the photoresist stripper composition in this invention suitable for the re-working of TFT array substrate covered by negative photoresist materials.

TABLE 2A

Negative photoresist cleaning performance and copper etching rate

| | Example 1 | Example 2 | Example 3 | Example 4 | Example 5 | Example 6 | Example 7 |
|---|---|---|---|---|---|---|---|
| Negative photoresist cleaning performance | ○ | ◎ | ◎ | ◎ | ◎ | ◎ | ◎ |
| Copper etching rate | Pass | Pass | Pass | Pass | Pass | Pass | Pass |

TABLE 2B

Negative photoresist cleaning performance and copper etching rate

| | Example 8 | Example 9 | Example 10 | Example 11 | Example 12 | Example 13 | Example 14 |
|---|---|---|---|---|---|---|---|
| Negative photoresist cleaning performance | ◎ | X | X | X | X | ◎ | V |

TABLE 2B-continued

Negative photoresist cleaning performance and copper etching rate

| | Example 8 | Example 9 | Example 10 | Example 11 | Example 12 | Example 13 | Example 14 |
|---|---|---|---|---|---|---|---|
| Copper etching rate | Pass | Pass | Pass | Pass | Pass | Fail | Pass |

TABLE 2C

Negative photoresist cleaning performance and copper etching rate

| | Example 15 | Example 16 | Example 17 |
|---|---|---|---|
| Negative photoresist cleaning performance | Δ | Δ | Δ |
| Copper etching rate | Pass | Pass | Pass |

In Table 4, the positive photoresist cleaning performance and the copper etching rate of the samples in Examples 18 to 22 are reported. Samples in Examples 18 and 19 have much better photoresist cleaning performance compared with samples in Examples 20 to 22.

When water was used instead of a polar aprotic solvent, the photoresist materials were not removed from the TFT array substrate at all. Similar negative results were also observed when the polar aprotic solvent was replaced by protic solvents.

In the meanwhile, samples in Examples 18 and 19 also have acceptable copper etching rates, making the photoresist stripper composition in this invention suitable for the re-working of TFT array substrate covered by positive and/or negative photoresist materials.

TABLE 3

Photoresist stripper compositions

| | Weight % | | | | |
|---|---|---|---|---|---|
| Component | Example 18 | Example 19 | Example 20 | Example 21 | Example 22 |
| Mono-choline compound | 7 | 10.5 | 10.5 | 10.5 | 10.5 |
| DMSO | | 20 | | | |
| NMP | 58.3 | 50 | | | |
| DGME | 16.7 | | | | |
| MEA | | | | | 20 |
| Diethylene-triamine | | | | 50 | 50 |
| Deionized water | 18 | 19.5 | 89.5 | 39.5 | 19.5 |
| Total | 100 | 100 | 100 | 100 | 100 |

TABLE 4

Positive photoresist cleaning performance and copper etching rate

| | Example 18 | Example 19 | Example 20 | Example 21 | Example 22 |
|---|---|---|---|---|---|
| Positive photoresist cleaning performance | ◎ | ◎ | ◎ | X | X |

TABLE 4-continued

Positive photoresist cleaning performance and copper etching rate

| | Example 18 | Example 19 | Example 20 | Example 21 | Example 22 |
|---|---|---|---|---|---|
| Copper etching rate | Pass | Pass | Pass | Pass | Pass |

In table 6, the stability of the samples in Example 23 and 24 are reported. It is found that sample 23 has better stability compared with sample 24 after 48 hours.

TABLE 5

Photoresist stripper compositions

| | Weight % | |
|---|---|---|
| Component | Example 23 | Example 24 |
| Mono-choline | 9.6 | |
| Tris-choline | | 9.6 |
| DMSO | 54 | 54 |
| MEA | 8 | 8 |
| Deionized water | 28.4 | 28.4 |
| Total | 100 | 100 |

TABLE 6

Stability of the photoresist stripper composition

| | 0 hour | 24 hours | 48 hours | 72 hours | 96 hours |
|---|---|---|---|---|---|
| Example 23 | Pass | Pass | Pass | Pass | Pass |
| Example 24 | Pass | Pass | Pass | Fail | Fail |

What is claimed is:

1. A photoresist stripper composition comprising:
    (a) at least one choline compound;
    (b) at least one polar aprotic solvent; and
    (c) water;
    wherein the amount of the choline compound is from 7 to 50% by weight based on the total weight of the composition.

2. The photoresist stripper composition according to claim 1, wherein the choline compound is selected from choline hydroxide, choline bicarbonate, choline chloride, choline bitartrate, choline dihydrogen citrate, choline sulphate and any combination thereof.

3. The photoresist stripper composition according to claim 1, wherein the choline compound has one hydroxyethyl group attached to the central nitrogen.

4. The photoresist stripper composition according to claim 1, wherein the amount of the choline compound is from 7 to 30% by weight based on the total weight of the composition.

5. A photoresist stripper composition comprising:
a) at least one choline compound;
b) at least one polar aprotic solvent; and
c) water;
wherein the amount of the choline compound is from 9 to 18% by weight based on the total weight of the composition.

6. The photoresist stripper composition according to claim 1, wherein the amount of the water is greater than or equal to 11% by weight based on the total weight of the composition.

7. The photoresist stripper composition according to claim 1, wherein the amount of the water is from 13% to 87.5% by weight based on the total weight of the composition.

8. The photoresist stripper composition according to claim 1, wherein the amount of the aprotic polar solvent is from 15 to 85% by weight based on the total weight of the composition.

9. The photoresist stripper composition according to claim 1, wherein the amount of the aprotic polar solvent is from 15 to 75% by weight based on the total weight of the composition.

10. The photoresist stripper composition according to claim 1, wherein the polar aprotic solvent is selected from N-methyl pyrrolidone, dimethyl sulfoxide, dimethylformamide, 1,3-dimethyl-2-imidazolidinone, propylene carbonate and any combination thereof.

11. The photoresist stripper composition according to claim 1, further comprising at least one alkaline substance.

12. The photoresist stripper composition according to claim 11, wherein the alkaline substance has a pKa value of 7 to 11 when dissolved in water at 25° C.

13. The photoresist stripper composition according to claim 11, wherein the alkaline substance is selected from sodium bicarbonate, potassium bicarbonate, sodium carbonate, potassium carbonate, calcium carbonate, magnesium carbonate, calcium hydroxide, magnesium hydroxide, aminopyridine, butylamine, chloridine, diethanolamine, dimethylamine, dimethylimidazole, ephedrine, ethanolamine, ethylmorpholine, glycylglycine, hydroxypyroline, piperidine, propylamine, methylamine, methylimidazole, triethylamine, triethanolamine, trimethylamine, tris(hydroxymethyl)aminomethanol, 2-amino-2-ethyl-1,3-propanediol, 2-amino-2-methyl-1,3-propanediol, 2-amino-2-methyl-1-propanol, and any combination thereof.

14. The photoresist stripper composition according to claim 11, wherein the amount of the alkaline substance is 5 to 30% by weight based on the total weight of the composition.

15. The photoresist stripper composition according to claim 11, wherein the amount of the alkaline substance is from 10 to 20% by weight based on the total weight of the composition.

16. The photoresist stripper composition according to claim 1, comprising:
(a) From 7 to 30% by weight of at least one choline compound;
(b) from 10 to 90% by weight of at least one polar aprotic solvent;
(c) from 11 to 87.5% by weight of water; and
(d) from 0 to 50% by weight of at least one alkaline substance;
wherein the weight percentages of all components add up to 100% by weight.

17. A clean substrate obtained by removing photoresist materials covered on a substrate by using the photoresist stripper composition according to claim 1.

18. A photoresist cleaning performance assessing method for the photoresist stripper composition according to claim 1, comprising steps of:
(a) warming the photoresist stripper composition;
(b) soaking a substrate covered by photoresist materials in the warmed photoresist stripper composition;
(c) rinsing the substrate with water; and
(d) observing the surface of the substrate for the removal of photoresist materials.

19. A metal etching assessing method for a photoresist stripper composition, comprising steps of:
(a) measuring the thickness ($\omega$) and initial resistivity ($Rs_{(pre)}$) of a metal substrate;
(b) warming a photoresist stripper composition comprising:
1) at least one choline compound;
2) at least one polar aprotic solvent; and
3) water;
wherein the amount of the choline compound is from 2.5 to 50% by weight based on the total weight of the composition;
(c) soaking the metal substrate in the warmed photoresist stripper composition and recording the soaking time (t);
(d) measuring the post resistivity ($Rs_{(post)}$) of the metal substrate; and
(e) calculating the metal etching rate (ER) according to the following formula:

$$ER = Rs_{(pre)} \omega (1/Rs_{(pre)} - 1/Rs_{(post)})/t.$$

* * * * *